(12) United States Patent
Ishimura et al.

(10) Patent No.: US 7,808,065 B2
(45) Date of Patent: Oct. 5, 2010

(54) SEMICONDUCTOR LIGHT RECEIVING ELEMENT

(75) Inventors: Eitaro Ishimura, Tokyo (JP); Masaharu Nakaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 167 days.

(21) Appl. No.: 12/129,751

(22) Filed: May 30, 2008

(65) Prior Publication Data
US 2009/0218594 A1 Sep. 3, 2009

(30) Foreign Application Priority Data
Feb. 28, 2008 (JP) .............................. 2008-047230

(51) Int. Cl.
*H01L 31/0232* (2006.01)
(52) U.S. Cl. ...................... 257/436; 257/444; 257/438; 257/184; 257/185; 257/186; 257/E31.005
(58) Field of Classification Search ......... 257/184–186, 257/E31.005, 291–294, 431–442, 200, 623, 257/624, 653, 458, 461, 465, 466; 438/602–606, 438/597–598, 620–621
See application file for complete search history.

(56) References Cited

U.S. PATENT DOCUMENTS

| 5,479,032 A | * | 12/1995 | Forrest et al. | ........... 257/190 |
| 2003/0151052 A1 | * | 8/2003 | Kawano et al. | ........... 257/79 |
| 2004/0173788 A1 | * | 9/2004 | Takizawa | ........... 257/12 |
| 2006/0202207 A1 | * | 9/2006 | Sagawa et al. | ........... 257/72 |
| 2008/0181267 A1 | * | 7/2008 | Imai et al. | ........... 372/29.011 |

FOREIGN PATENT DOCUMENTS

| JP | 57066662 A | * | 4/1982 |
| JP | 63-127586 A | | 5/1988 |
| JP | 64-59966 A | | 3/1989 |
| JP | 4-32270 A | | 2/1992 |
| JP | 4-230081 A | | 8/1992 |
| JP | 4-252080 A | | 9/1992 |
| JP | 2000-164916 A | | 6/2000 |

* cited by examiner

*Primary Examiner*—Lynne A Gurley
*Assistant Examiner*—Naima J Kearney
(74) *Attorney, Agent, or Firm*—Leydig, Voit & Mayer, Ltd.

(57) ABSTRACT

A semiconductor photosensitive element comprises: a semiconductor substrate of a first conductivity type; a first light absorption layer, a first semiconductor layer of a second conductivity type, a first semiconductor layer of the first conductivity type, a second light absorption layer, and a second semiconductor layer of a second conductivity type, arranged in this order on the semiconductor substrate; a first electrode connected the second semiconductor layer of the second conductivity type; a second electrode connected to the semiconductor substrate; and a third electrode electrically connecting the first semiconductor layer of the first conductivity type to the first semiconductor layer of the second conductivity type. The third electrode is located outside a light detection region for detecting optical signals.

11 Claims, 14 Drawing Sheets

SEMICONDUCTOR LIGHT RECEIVING ELEMENT

BACKGROUND OF THE INVENTION

1. Field of the Invention

The present invention relates to a semiconductor photosensitive element that can be easily fabricated, has a high light receiving sensitivity, and can be operated at a high speed without applying a bias voltage from the outside.

2. Background Art

A photodiode (PD) has been used to receive optical signals and obtain current signals. Particularly, in order to receive fast modulated optical signals and obtain fast modulated current signals, a reverse bias of at least 0.5 V must be applied to the PD from the outside. Since a light absorption layer is depleted by the reverse bias, and an electric field is applied to a depletion layer, electrons and holes can be rapidly transferred. By the spread of the depletion layer, the capacitance is lowered in inverse proportion to the thickness of the depletion layer, enabling higher-speed operation.

[Patent Document 1] Japanese Patent Application Laid-Open No. 2000-164916

[Patent Document 2] Japanese Patent Application Laid-Open No. 63-127586

[Patent Document 3] Japanese Patent Application Laid-Open No. 64-59966

[Patent Document 4] Japanese Patent Application Laid-Open No. 4-252080

[Patent Document 5] Japanese Patent Application Laid-Open No. 4-230081

In some applications, optical signals transmitted through an optical fiber are photo-electrically converted in a PD to electrical signals, which are transmitted in the form of electric waves as received without passing through a power amplifier. In this case, a feed line must be provided to apply a reverse bias to the PD from the outside. However, a PD that could operate at a high speed without a reverse bias from the outside would be used to eliminate the feed line. It is conceivable, as such a semiconductor photosensitive element, to stack two PDs and use one of the PDs to generate a bias.

Although it is not for high-speed operation, a semiconductor photosensitive element wherein two or more PDs are stacked has been proposed (for example, refer to Patent Documents 1 to 5). In Patent Document 1, a semiconductor photosensitive element of pin-nip junction is described. Such a semiconductor photosensitive element is not suited to high-speed operation, because the currents in reverse directions generated in a pin-PD and an nip-PD are canceled out each other.

In Patent Documents 2 to 5, semiconductor photosensitive elements wherein pin junctions are repeatedly laminated are described. However, since the n-p junction formed between laminated pin junctions blocks the flow of DC current, PDs do not operate. Therefore, in Patent Document 4, the insertion of an ohmic layer composed of amorphous silicon, chromium, aluminum, ITO, or the like between pin junctions is proposed. However, the ohmic layer as described above cannot be crystal-grown between pin-PD laminated structures having InGaAs absorption layers used in optical communications. Even if the ohmic layer can be inserted, since the ohmic layer does not transmit light and has a high resistance, light receiving sensitivity is low, and high-speed operation cannot be realized.

SUMMARY OF THE INVENTION

To solve problems as described above, it is an object of the present invention to provide a semiconductor photosensitive element that can be easily fabricated, has a high light receiving sensitivity, and can be operated at a high speed without applying a bias voltage from the outside.

According to one aspect of the present invention, a semiconductor photosensitive element comprises: a semiconductor substrate of a first conductivity type; a first light absorption layer, a first semiconductor layer of a second conductivity type, a first semiconductor layer of the first conductivity type, a second light absorption layer, and a second semiconductor layer of a second conductivity type, formed in this order on said semiconductor substrate; a first electrode connected to said second semiconductor layer of the second conductivity type; a second electrode connected to said semiconductor substrate; and a third electrode electrically connecting said first semiconductor layer of the first conductivity type to said first semiconductor layer of the second conductivity type; wherein said third electrode is formed outside a light receiving region for receiving optical signals.

According to the present invention, a semiconductor photosensitive element that can be easily fabricated, has a high light receiving sensitivity, and can be operated at a high speed without applying a bias voltage from the outside can be provided.

Other and further objects, features and advantages of the invention will appear more fully from the following description.

DETAILED DESCRIPTION OF THE PREFERRED EMBODIMENTS

First Embodiment

Figure 1:
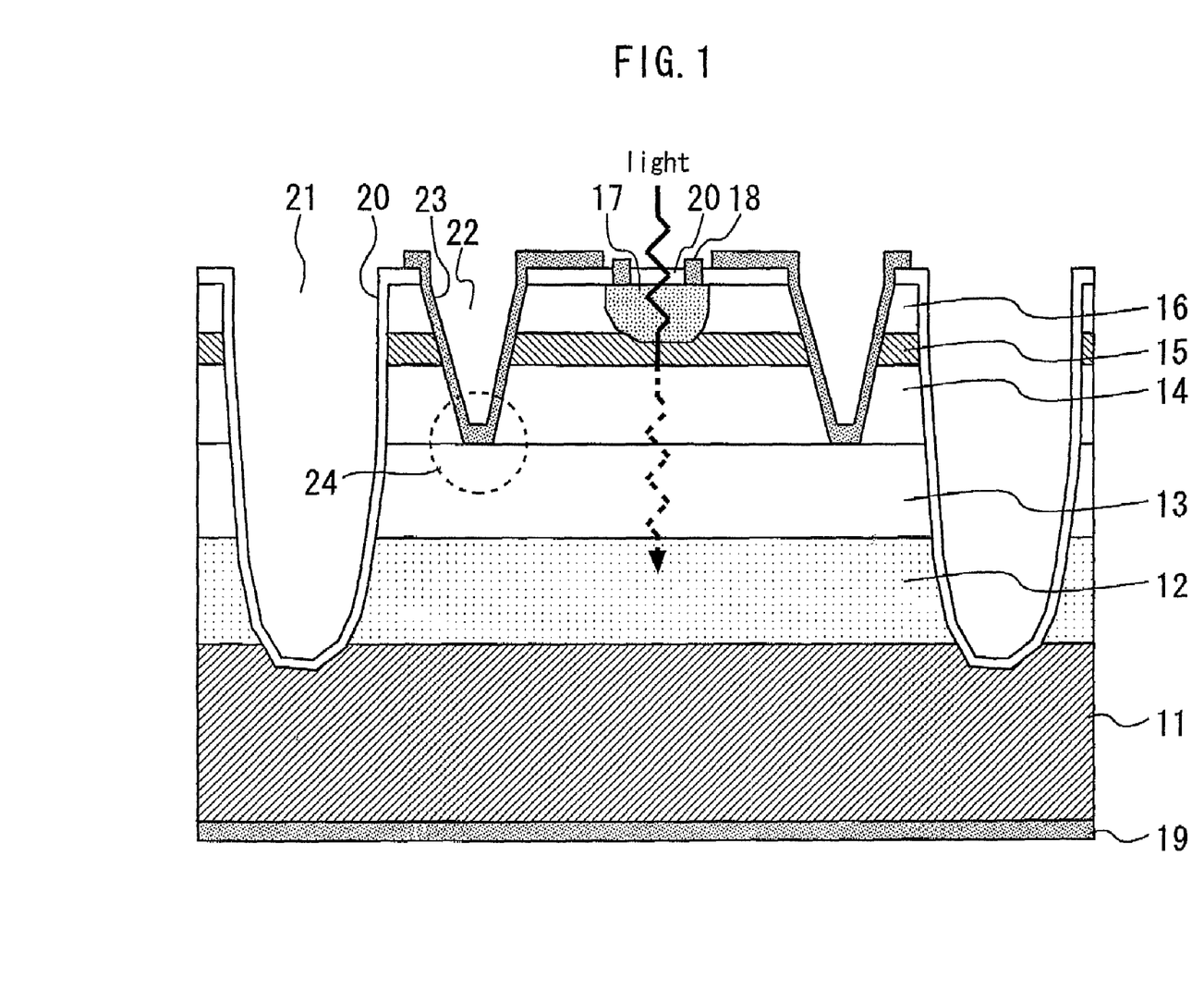
FIG. 1 is a sectional view showing a semiconductor photosensitive element according to the first embodiment of the present invention.

FIG. 1 is a sectional view showing a semiconductor photosensitive element according to the first embodiment of the present invention. An undoped (low carrier concentration) InGaAs light absorption layer 12 (first light absorption layer), a p-type InP layer 13 (first semiconductor layer of second conductivity type), an n-type InP layer 14 (first semiconductor layer of first conductivity type), an undoped (low carrier concentration) InGaAs light absorption layer 15 (second light absorption layer), and undoped (low carrier concentration) n-type InP layer 16 are formed in this order on an n-type InP substrate 11 (semiconductor substrate of first conductivity type).

In a light receiving region that receives light, a p-type region 17 where a p-type dopant, such as zinc, is selectively diffused (second semiconductor layer of second conductivity type) is formed on a part of the n-type InP layer 16. An anode (p-side) 18 (first electrode) is connected to the p-type region 17, and a cathode (n-side) electrode 19 (second electrode) is connected to the lower surface of the n-type InP substrate 11. An insulating film 20, such as an SiN film, that serves as both an antireflective film and a surface protective film is formed on the n-type InP layer 16.

A groove 21 is formed to reach the n-type InP substrate 11 from the n-type InP layer 16. The groove 21 is coated with the insulating film 20. In the outside of the light receiving region that receives optical signals, a groove 22 is formed from the n-type InP layer 16 to the n-type InP layer 14. On the bottom of the groove 22, a metal electrode 23 (third electrode) electrically connects the n-type InP layer 14 to the p-type InP layer 13 (ohmic junction 24). The anode 18, the cathode 19, and the metal electrode 23 are not connected to each other, and are electrically independent.

Figure 2:
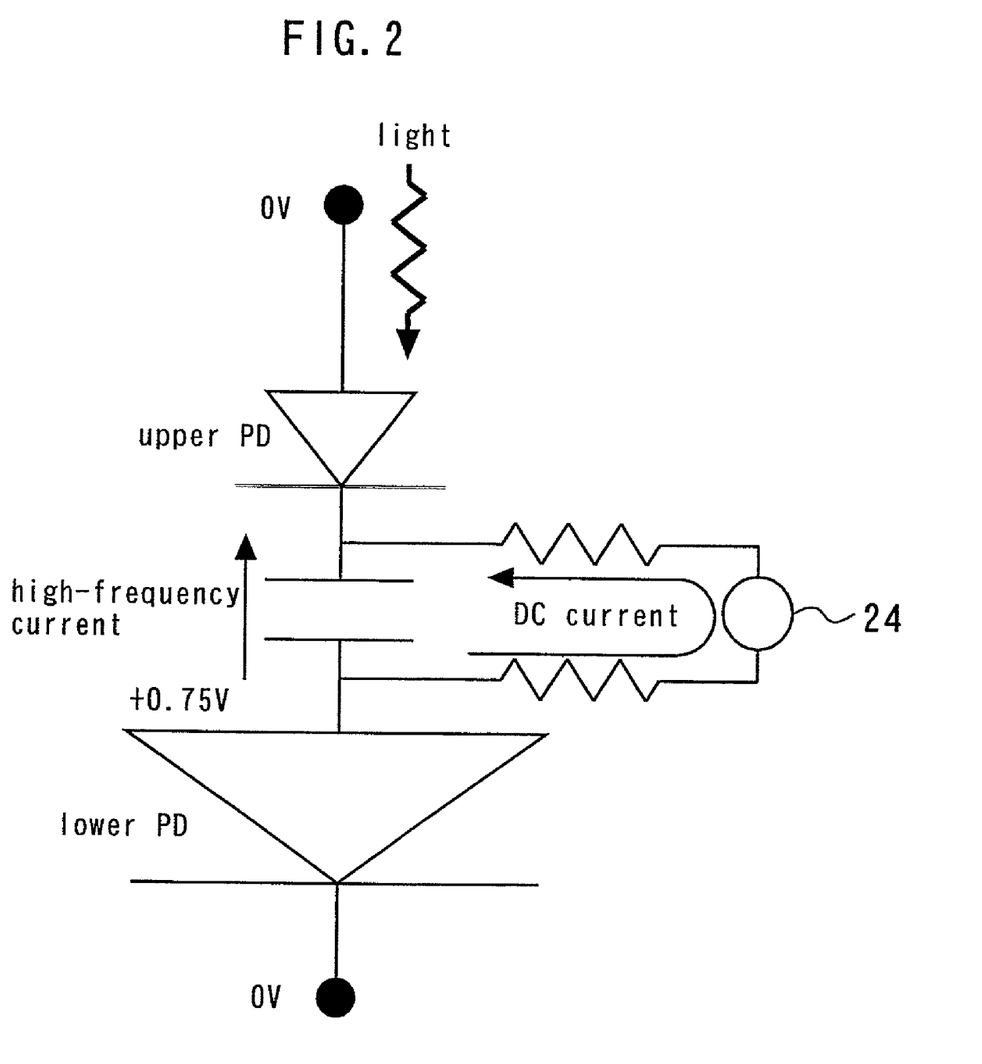
FIG. 2 is a diagram showing an equivalent circuit of a semiconductor photosensitive element shown in FIG. 1.

FIG. 2 is a diagram showing an equivalent circuit of a semiconductor photosensitive element shown in FIG. 1. An upper PD and a lower PD are connected in series. The upper PD is composed of a p-type region 17, an InGaAs light absorption layer 15, and an n-type InP layer 14; and the lower PD is composed of a p-type InP layer 13, an InGaAs light absorption layer 12, and an n-type InP substrate 11.

Light incident into the upper PD is absorbed in the InGaAs light absorption layer 15. Transmitted light that remains unabsorbed is absorbed into the InGaAs light absorption layer 12 of the lower PD to generate electric current. By the current generated in the lower PD, an electromotive force of +0.75 V, equivalent to the built-in potential of the InGaAs light absorption layer 12 is generated. When the photocurrent generated from the lower PD is larger than the photocurrent generated in the upper PD, the ohmic junction 24 has a potential of +0.75 V. Therefore, since a reverse bias of 0.75 V is applied to the upper PD, and a depletion layer spreads, high-speed operation can be achieved. In addition, since the lower PD functions as a DC source PD for applying a bias voltage to the upper PD, no application of a bias voltage from the outside is required.

Since the ohmic junction 24 is a pin-metal-pin junction, a DC current easily flows. However, the current path via the ohmic junction 24, which has a high resistance, does not suited to high-speed operation. On the other hand, the n-p junction composed of the n-type InP layer 14 and the p-type InP layer 13 is equivalent to a capacitor having a large capacitance, and a high-frequency current easily flows although no DC current flows. Therefore, the high-frequency current flows through the n-p junction, and the DC current flows through the ohmic junction 24 having a high resistance. In this way, separating the path of the high-frequency current from the path of the DC current enables high-speed operation.

Since a metal electrode 23 is formed outside the light receiving region and does not block incident light, a high light receiving sensitivity can be obtained. Furthermore, although the crystal growth of ohmic layers as in conventional example is difficult, the metal electrode 23 can be easily formed.

In addition, the lower PD for a DC power source must have a large capacitance so as not to generate modulation signal current when high-frequency optical signals are incident. Therefore, the area of the p-type region 17 in the upper PD is preferably smaller than the area of the p-type InP layer 13 of the lower PD so that the p-n junction diameter of the lower PD is larger than that of the upper PD for high-speed operation. Alternatively, the area of the metal electrode 23 is preferably large enough to elevate the electrode capacitance.

To operate the semiconductor light receiving element according to the first embodiment without applying a bias regardless of operating conditions, the current generated by the lower PD must be always larger than the current generated by the upper PD. Therefore, the absorption layers of the upper PD and the lower PD are formed of a semiconductor material having the same composition to have the same band gaps. This is because the wavelength dependence and temperature dependence of the absorption coefficient vary when the band gap of the absorption layer varies, and the currents generated by the both PDs are imbalanced by changes in incident wavelength and operating temperature so that the upper PD cannot operate at high speed.

Figure 3:
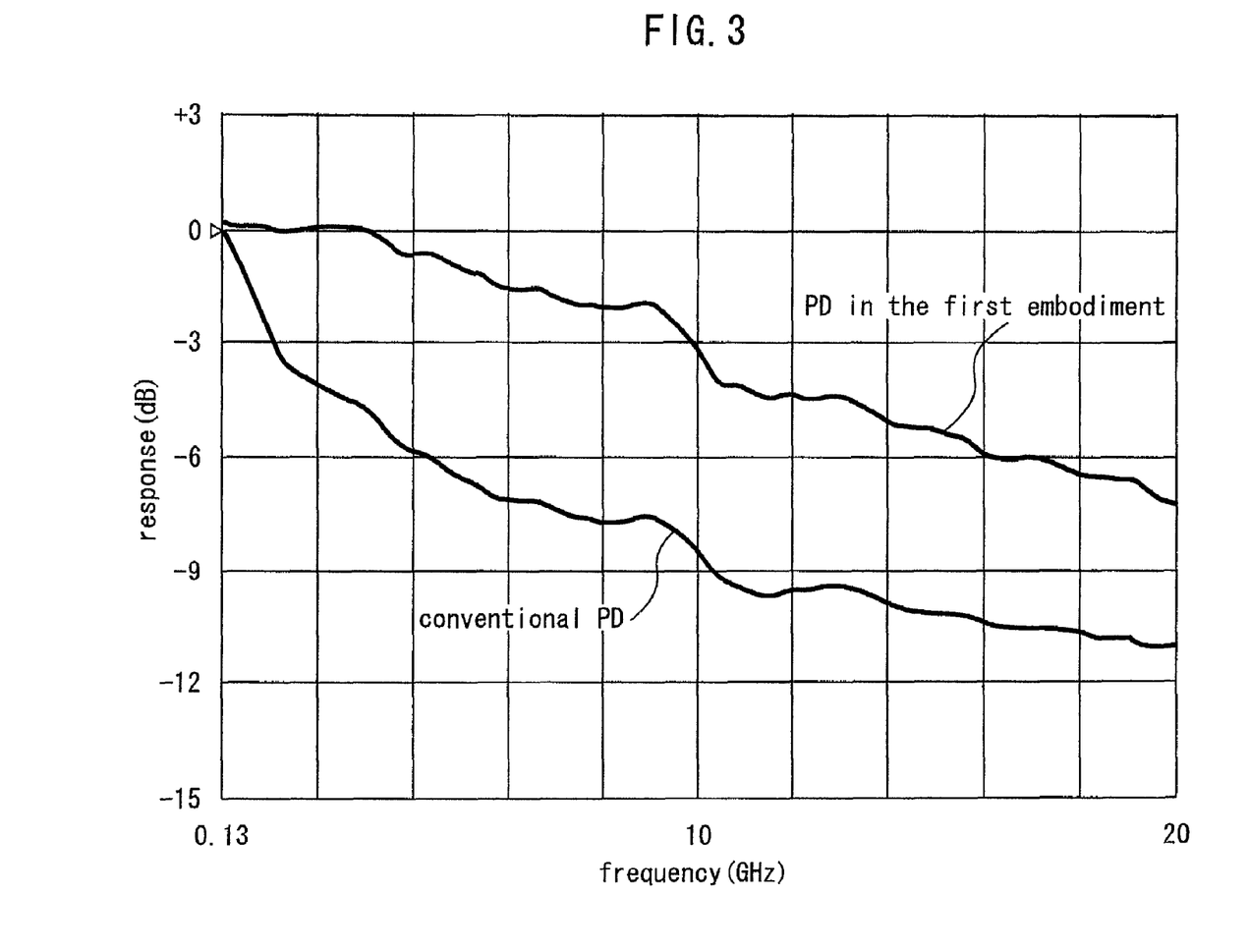
FIG. 3 is a graph showing the measured results of frequency response characteristics without a bias voltage.

FIG. 3 is a graph showing the measured results of frequency response characteristics without a bias voltage. In a conventional PD for 10 Gbps, although a cutoff frequency of at least 10 GHz (frequency to become −3 dB) is obtained when a bias voltage is applied, a cutoff frequency of only about 1 GHz can be obtained when no bias voltage is applied. On the other hand, a cutoff frequency of about 10 GHz was obtained by the PD in the first embodiment. Therefore, it was confirmed that a high-speed operation could be achieved without applying a bias voltage from the outside.

Figure 4:
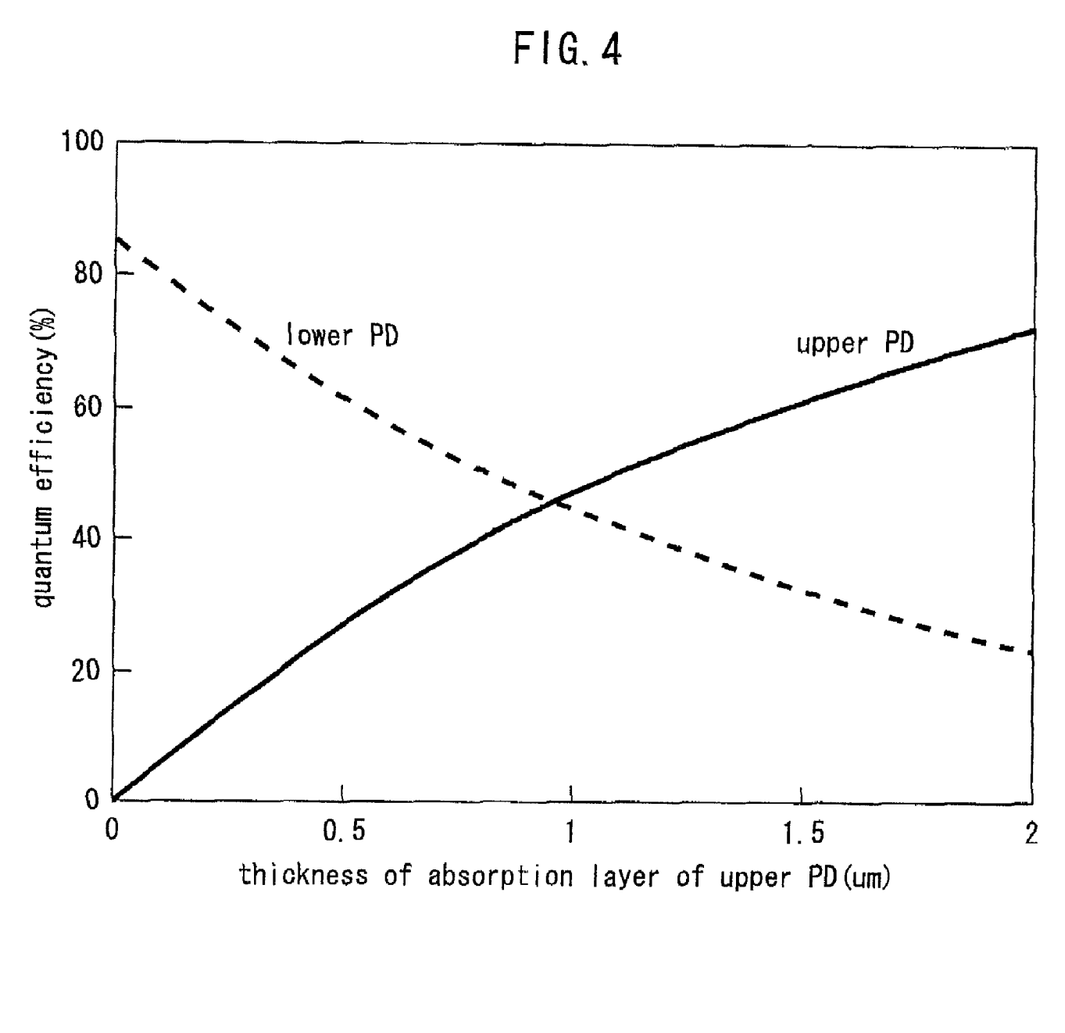
FIG. 4 is a graph showing the thickness dependence of quantum efficiency on the absorption layer of the upper PD.

FIG. 4 is a graph showing the thickness dependence of quantum efficiency on the absorption layer of the upper PD. The thickness of the light absorption layer of the lower PD was 3 μm. When a thicker absorption layer of the upper PD is used, the quantum efficiency of the upper PD is increased. However, when a thicker absorption layer of the upper PD is used, light is blocked, and the quantum efficiency of the lower PD is decreased. If the quantum efficiency of the upper PD is higher than the quantum efficiency of the lower PD, sufficient current cannot be supplied from the lower PD to the upper PD. Therefore, the optimum thickness value of the absorption layer of the upper PD is a thickness such that the quantum efficiency of the upper PD substantially matches the quantum efficiency of the lower PD, and the quantum efficiency of the lower PD is elevated (about 1 μm).

Second Embodiment

Figure 5:
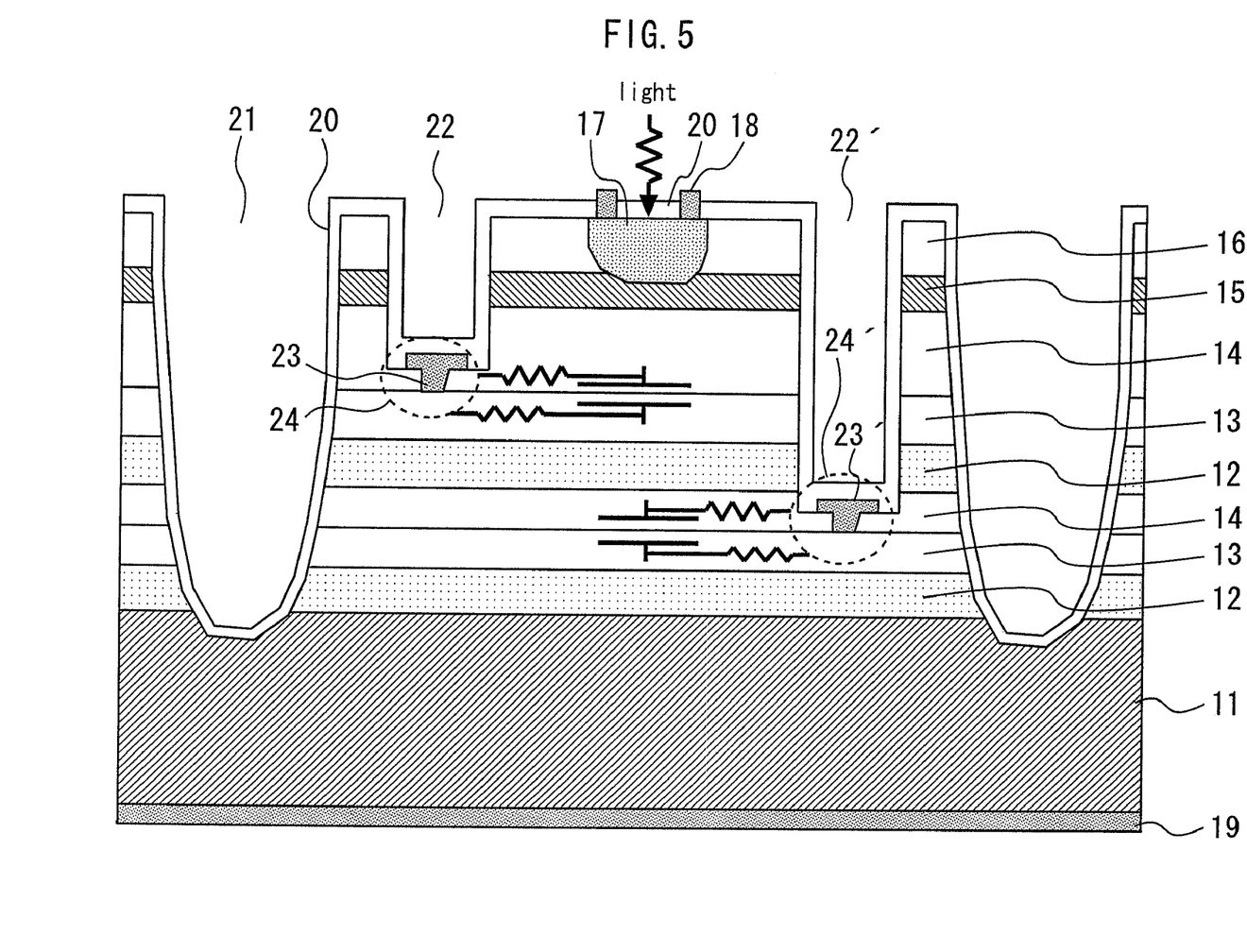
FIG. 5 is a sectional view showing a semiconductor photosensitive element according to the second embodiment of the present invention.

FIG. 5 is a sectional view showing a semiconductor photosensitive element according to the second embodiment of the present invention. Here, the constituents different from those of the first embodiment will be described.

Between an n-type InP substrate 11 and an InGaAs light absorption layer 12, an undoped (low carrier concentration) InGaAs light absorption layer 12' (third light absorption layer), a p-type InP layer 13' (third semiconductor layer of a second conductivity type), and an n-type InP layer 14' (second semiconductor layer of a first conductivity type) are formed in this order from the side of the n-type InP substrate 11.

A groove 22' is formed from the n-type InP layer 16 to the n-type InP layer 14' in the outside of the light receiving region. On the bottom of the groove 22', a metal electrode 23' (fourth electrode) electrically connects the n-type InP layer 14' to the p-type InP layer 13' (ohmic junction 24'). The anode 18, the cathode 19, and the metal electrodes 23 and 23' are not connected to each other, and are electrically independent.

Figure 6:
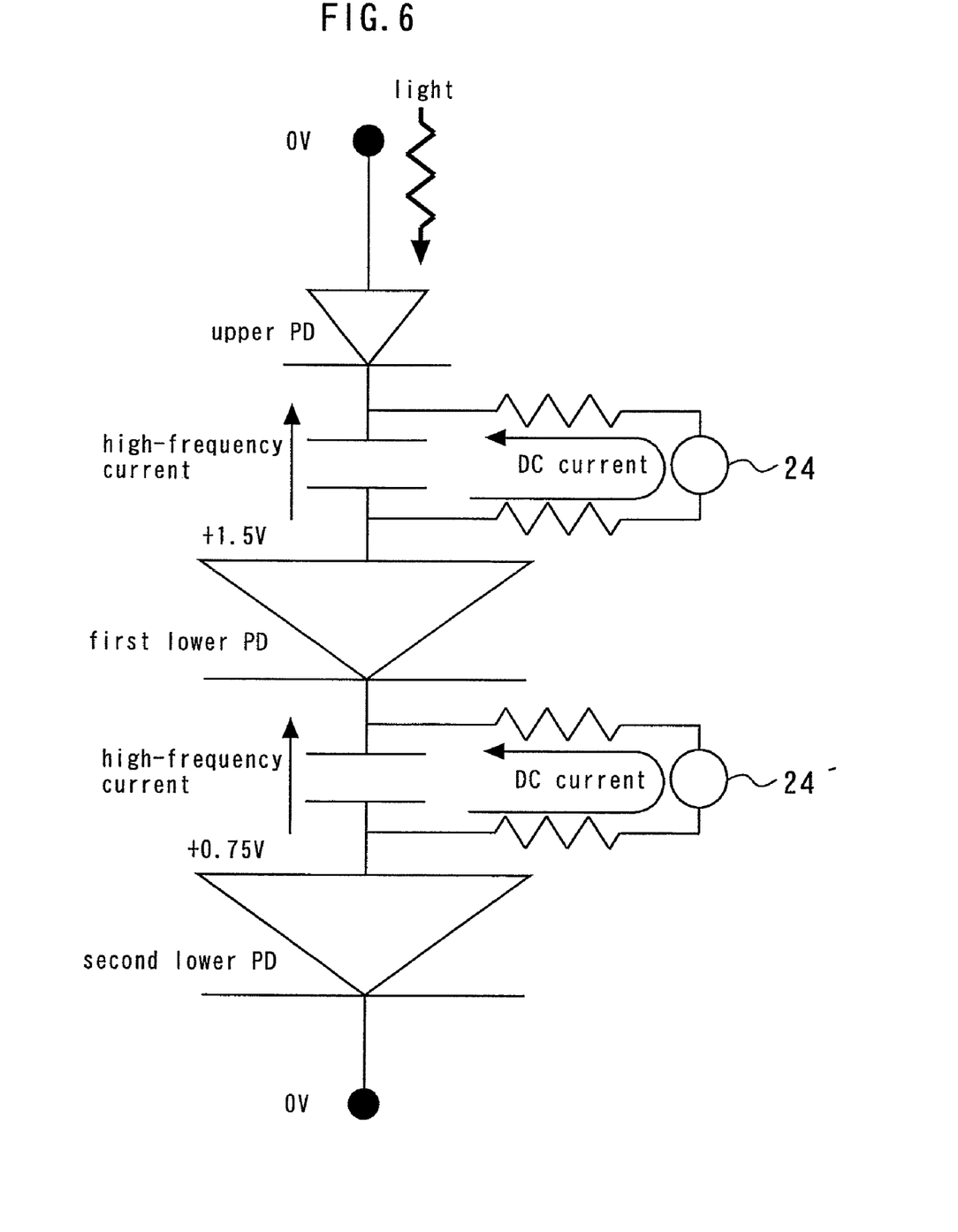
FIG. 6 is a diagram showing an equivalent circuit of the semiconductor photosensitive element shown in FIG. 5.

FIG. 6 is a diagram showing an equivalent circuit of the semiconductor photosensitive element shown in FIG. 5. Three PDs: an upper PD, a first lower PD and a second lower PD, are connected in series. The upper PD is composed of a p-type region 17, an InGaAs light absorption layer 15, and an n-type InP layer 14; the first lower PD is composed of a p-type InP layer 13, an InGaAs light absorption layer 12, and an n-type InP layer 14'; and the lower PD is composed of a p-type InP layer 13', an InGaAs light absorption layer 12', and an n-type InP substrate 11.

Light incident into the upper PD is absorbed in the InGaAs light absorption layer 15. Transmitted light that remains unabsorbed is absorbed into the InGaAs light absorption layers 12 and 12' of the first and second lower PDs to generate electric current. By the current generated in the first and second lower PDs, an electromotive force of +1.5 V, equivalent to twice the built-in potential of the InGaAs light absorption layers 12 and 12' is generated. When the photocurrent generated from the first and second lower PD is larger than the photocurrent generated in the upper PD, the ohmic junction 24 has a potential of +1.5 V. Therefore, the semiconductor photosensitive element according to second embodiment can apply a bias voltage higher than the bias voltage of the semiconductor photosensitive element according to the first embodiment to the upper PD. Otherwise, the effect similar to the effect of the first embodiment can be obtained.

Third Embodiment

Figure 7:
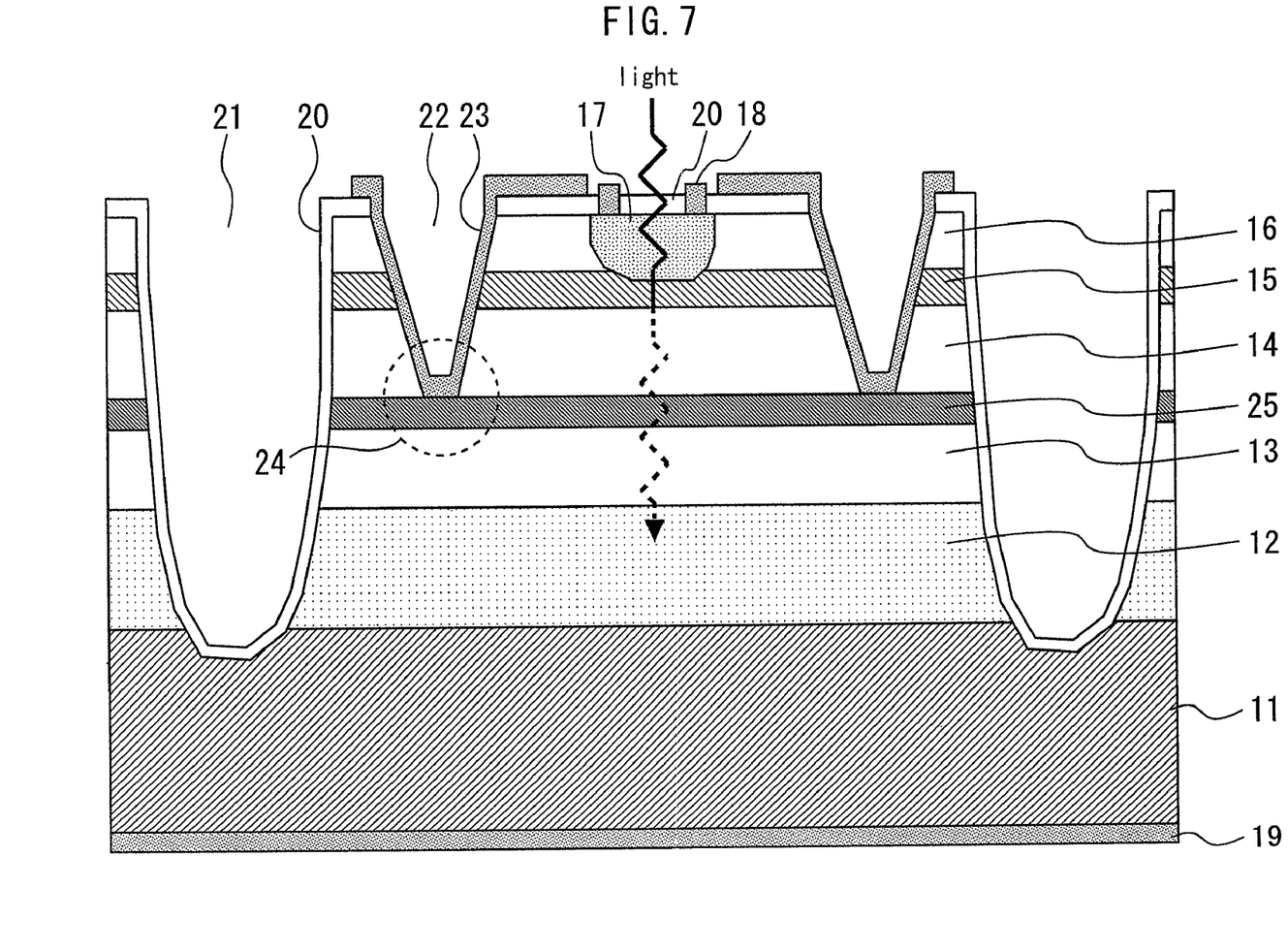
FIG. 7 is a sectional view showing a semiconductor photosensitive element according to the third embodiment of the present invention.

FIG. 7 is a sectional view showing a semiconductor photosensitive element according to the third embodiment of the present invention. A p-type InGaAsP contact layer 25 (upper layer) is formed between a p-type InP layer 13 (lower layer) and an n-type InP layer 14. Other constituents are the same as those of the first embodiment.

On the bottom of the groove 22, a metal electrode 23 electrically connects the n-type InP layer 14 to the p-type InP layer 13 (ohmic junction 24). The p-type InGaAsP contact layer 25 is formed of a material having a lower contact resistance with the metal electrode 23 than the p-type InP layer 13.

Consequently, the contact resistance with the metal electrode 23 can be lowered enabling further high-speed operation. The p-type InGaAsP contact layer 25 functions as an etching stopper layer when the groove 22 is formed, and also has the function to lower the sheet resistance of the p-type InP layer 13 of the lower PD.

The p-type InGaAsP contact layer 25 is preferably formed of a material having a band gap smaller than the band gap of the p-type InP layer 13, but large enough not to absorb incident light. For example, AlGaInAs can also be used other than InGaAsP.

Fourth Embodiment

Figure 8:
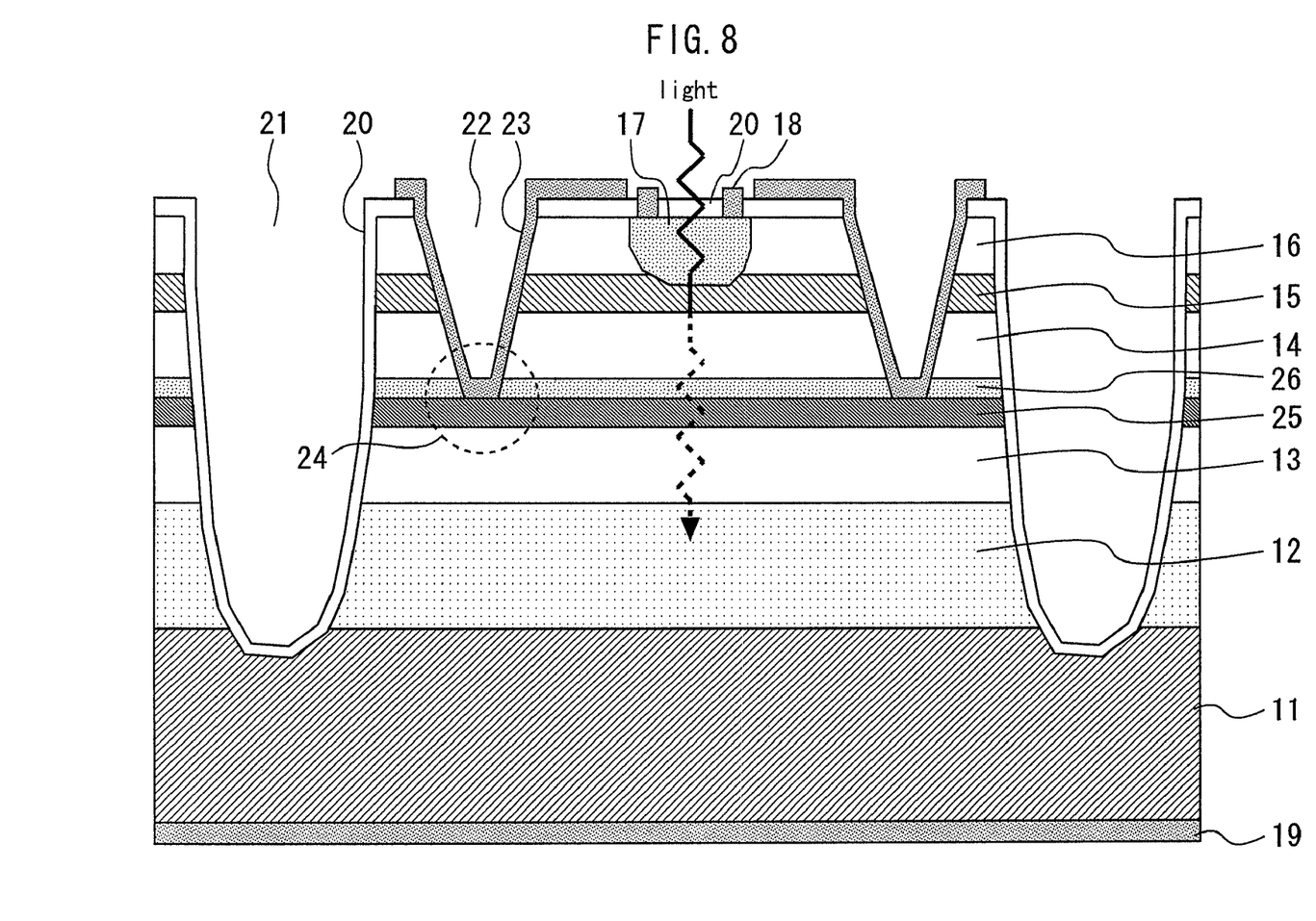
FIG. 8 is a sectional view showing a semiconductor photosensitive element according to the fourth embodiment of the present invention.

FIG. 8 is a sectional view showing a semiconductor photosensitive element according to the fourth embodiment of the present invention. An undoped (low carrier concentration) InP layer 26 (semiconductor layer) is inserted between a p-type InGaAsP contact layer 25 and an n-type InP layer 14. Other constituents are the same as those of the third embodiment.

When an upper PD and a lower PD are laminated, and the p-type InGaAsP contact layer 25 contacts the n-type InP layer 14, a problem of the mutual diffusion and mixing of their dopants is caused. Whereas, by the insertion of the undoped InP layer 26 as a spacer layer, the mutual diffusion can be prevented. As the materials for the spacer layer, InGaAsP or AlGaInAs can also be used other than InP.

Fifth Embodiment

Figure 9:
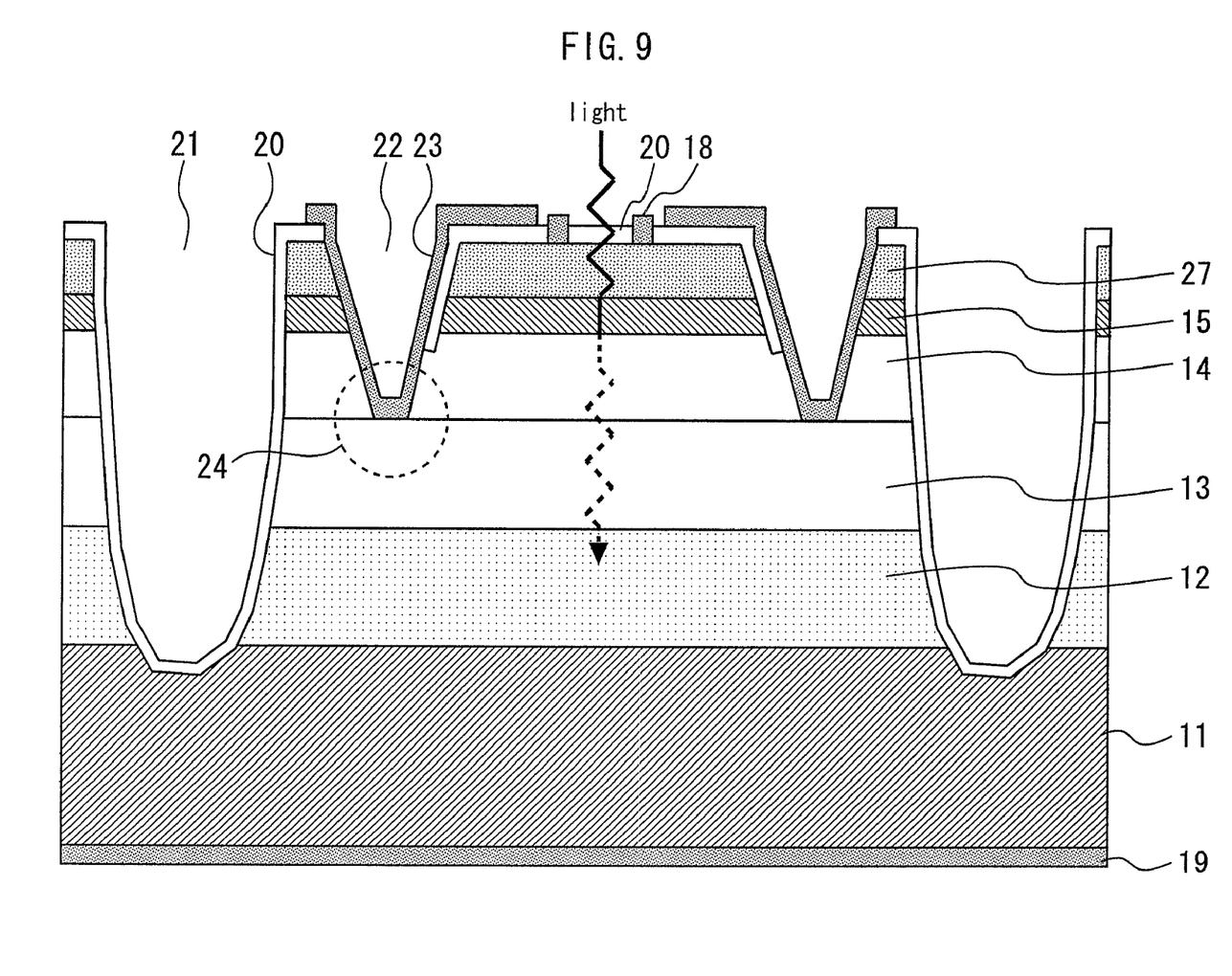
FIG. 9 is a sectional view showing a semiconductor photosensitive element according to the fifth embodiment of the present invention.

FIG. 9 is a sectional view showing a semiconductor photosensitive element according to the fifth embodiment of the present invention. In place of the n-type InP layer and the p-type region 17, a P-type InP layer 27 is formed. Other constituents are the same as those of the first embodiment. Specifically, although the upper PD in the first embodiment is a selective diffusion PD, the upper PD in the fifth embodiment is a mesa PD. Thereby, the effect similar to the effect of the first embodiment can be obtained.

Sixth Embodiment

Figure 10:
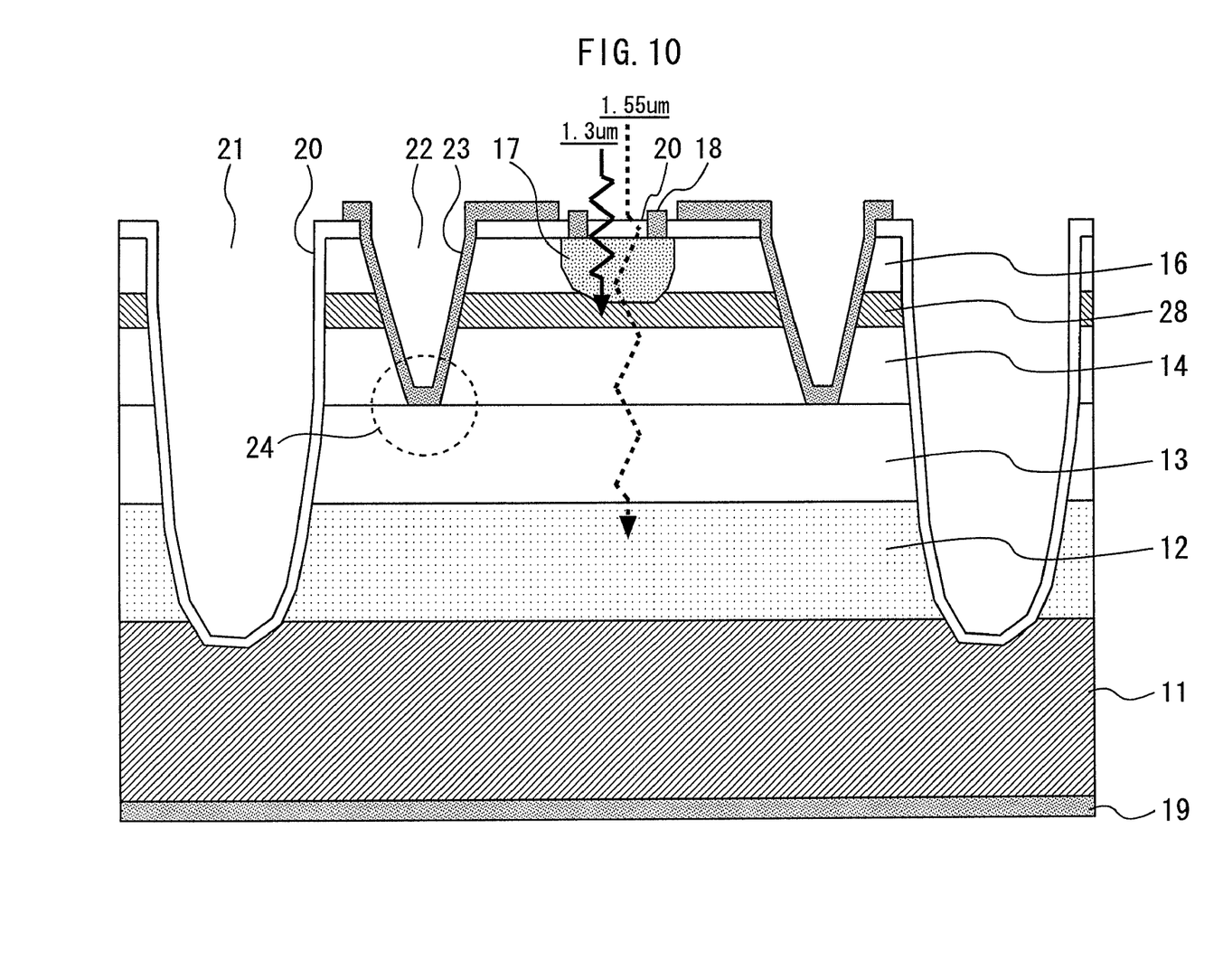
FIG. 10 is a sectional view showing a semiconductor photosensitive element according to the sixth embodiment of the present invention.

FIG. 10 is a sectional view showing a semiconductor photosensitive element according to the sixth embodiment of the present invention. In place of the InGaAs light absorption layer 15, an undoped (low carrier concentration) InGaAsP light absorption layer 28 (second light absorption layer) is formed. The band gap of the InGaAsP light absorption layer 28 is 1.4 μm wavelength, and is larger than the band gap of the InGaAs light absorption layer 12. Other constituents are the same as those of the first embodiment.

As a high-frequency signal, light having a short wavelength (for example, 1.3 μm wavelength) is transmitted; and as light for the lower PD, light having a long wavelength (for example, 1.55 μm wavelength) is transmitted. The light for the lower PD is not absorbed in the InGaAsP light absorption layer 28 of the upper PD. Therefore, even if the layer thickness of the upper PD is enlarged to elevate sensitivity, light for the lower PD is not blocked.

Seventh Embodiment

Figure 11:
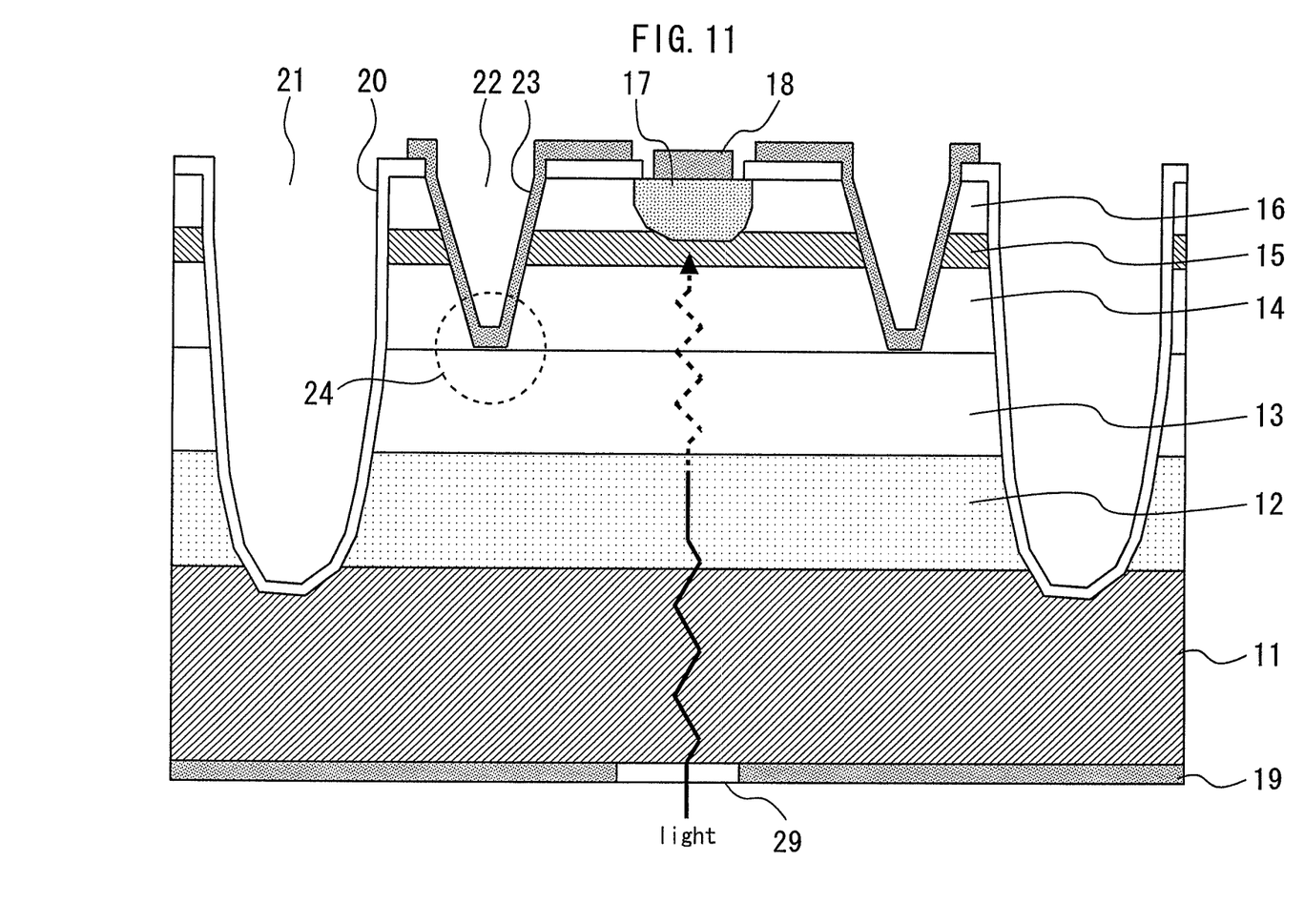
FIG. 11 is a sectional view showing a semiconductor photosensitive element according to the seventh embodiment of the present invention.

FIG. 11 is a sectional view showing a semiconductor photosensitive element according to the seventh embodiment of the present invention. An antireflective film 29 is formed on the lower surface of the n-type InP substrate 11. Other constituents are the same as those of the first embodiment.

In the semiconductor photosensitive element, light enters from the lower surface of the n-type InP substrate 11. Also in this case, the upper PD can be operated without applying a bias voltage from the outside. When light enters from the lower surface, the sensitivity of the upper PD can be elevated by the reflected light from the anode 18.

Eighth Embodiment

Figure 12:
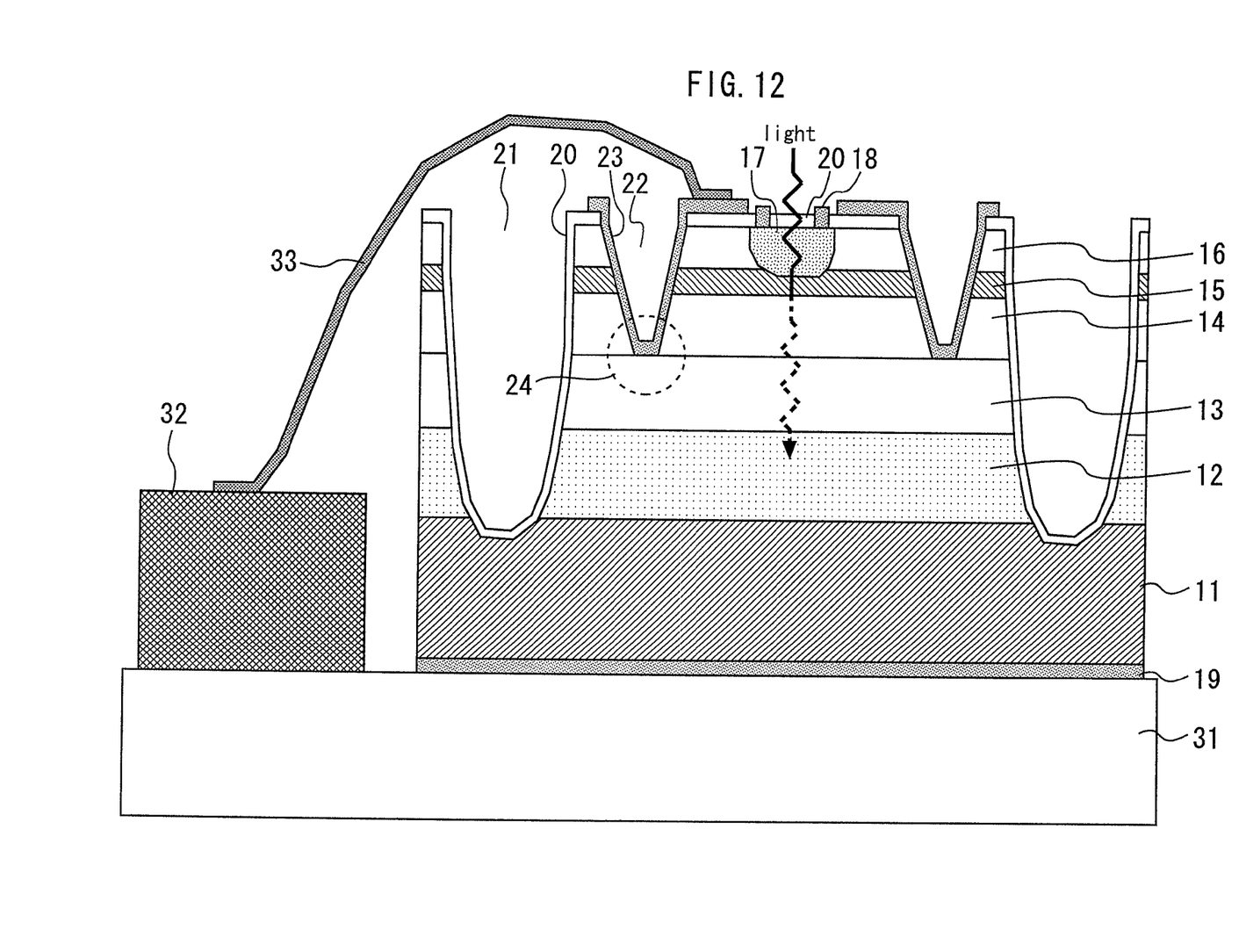
FIG. 12 is a sectional view showing a semiconductor photosensitive element according to the eighth embodiment of the present invention.

FIG. 12 is a sectional view showing a semiconductor photosensitive element according to the eighth embodiment of the present invention. A semiconductor photosensitive element is placed on a pedestal 31. An electrode metal 23 is connected to a chip capacitor 32 (capacitor) with a wire 33. Specifically, the chip capacitor 32 is connected between a cathode 19 and the metal electrode 23. Other constituents are the same as those of the first embodiment.

By connecting the capacitor to the lower PD for a CD power source in parallel, even if the quantity of incident light is varied, current can be stably supplied to the upper PD for high-speed operation.

Ninth Embodiment

Figure 13:
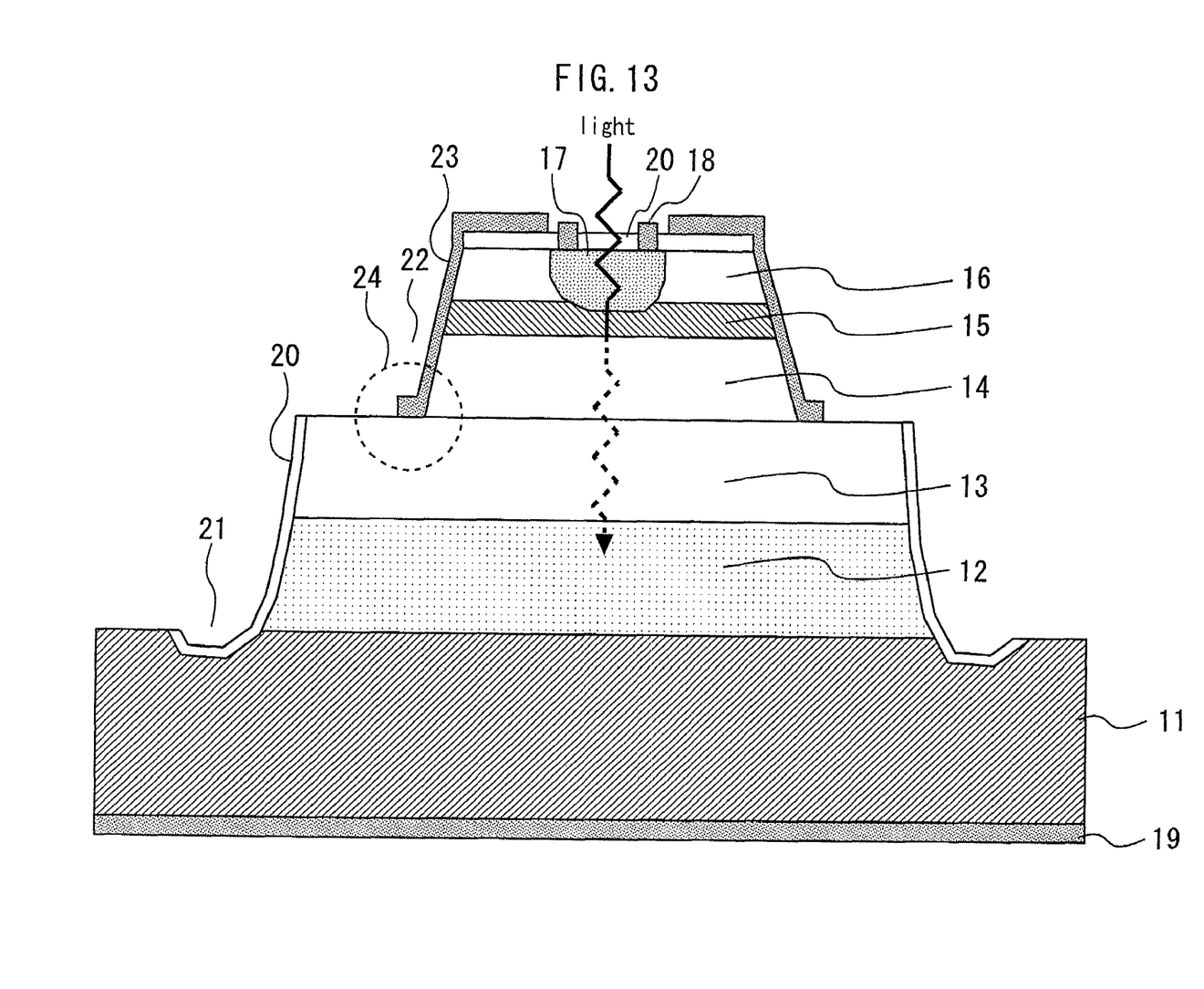
FIG. 13 is a sectional view showing a semiconductor photosensitive element according to the ninth embodiment of the present invention.

FIG. 13 is a sectional view showing a semiconductor photosensitive element according to the ninth embodiment of the present invention. One side of each of grooves 21 and 22 is removed, and the semiconductor laminated structure is formed in a trapezoidal shape. Other constituents are the same as those of the first embodiment. Thereby, since there are no fine grooves, processing can be easily carried out.

Tenth Embodiment

Figure 14:
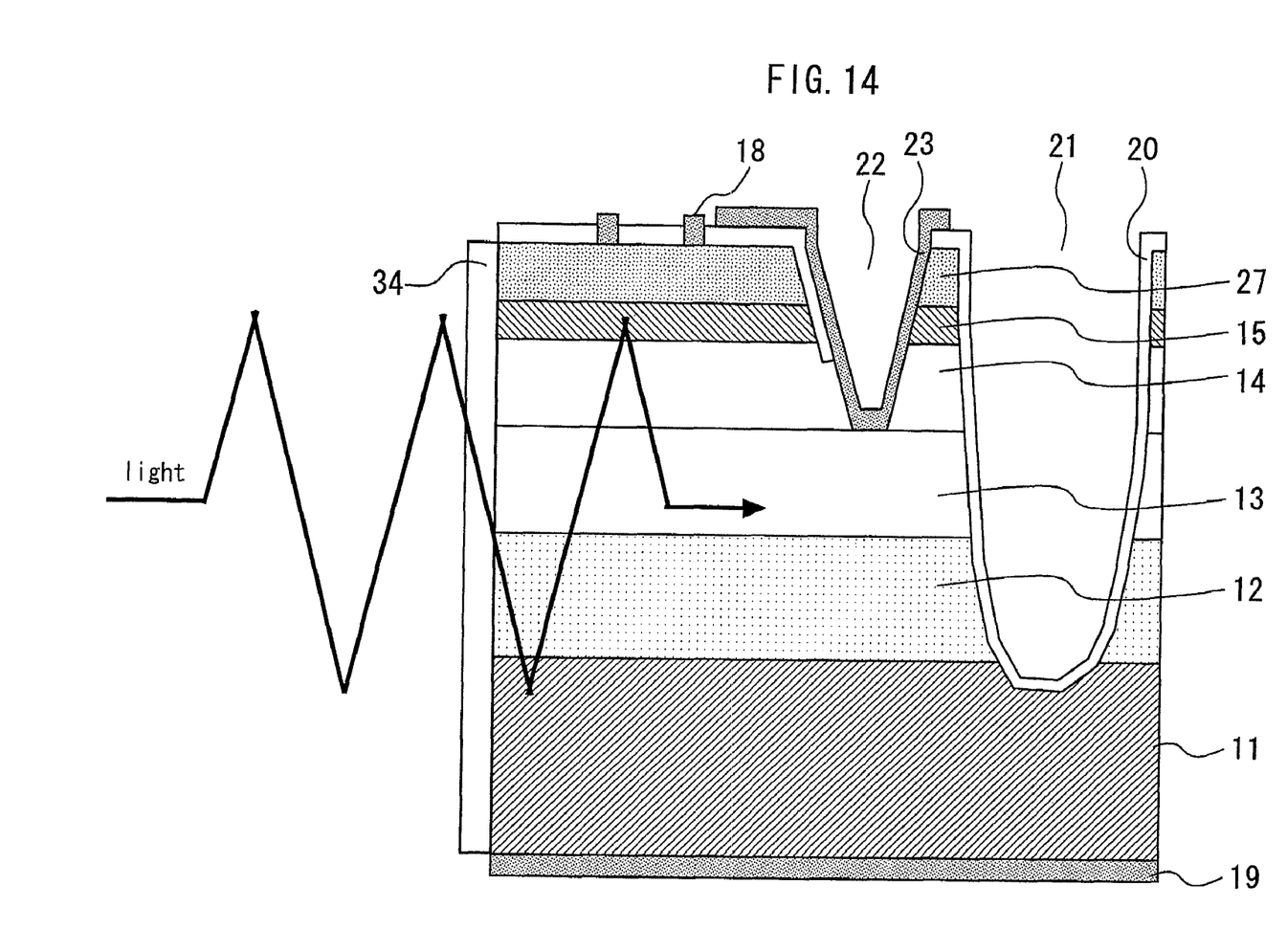
FIG. 14 is a sectional view showing a semiconductor photosensitive element according to the tenth embodiment of the present invention.

FIG. 14 is a sectional view showing a semiconductor photosensitive element according to the tenth embodiment of the present invention. An antireflective film 34 is formed on the end surface of a chip. Other constituents are the same as those of the first embodiment.

By such a waveguide-type PD that receives light from the end surface of the chip as described above, the quantity of light bonded to the upper PD and the quantity of light bonded to the lower PD can be controlled. Therefore, the power generation quantity of the loser PD for DC power source can be controlled to an optimal value.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-047230, filed on Feb. 28, 2008 including specification, claims, drawings and summary, on which the Convention priority of the present application is based, are incorporated herein by reference in its entirety.

What is claimed is:

1. A semiconductor photosensitive element comprising:
a semiconductor substrate of a first conductivity type;
a stack of semiconductor layers on said semiconductor substrate and including a first light absorption layer, a first semiconductor layer of a second conductivity type, a first semiconductor layer of the first conductivity type, and a second light absorption layer, arranged in this order on said semiconductor substrate, said second light absorption layer including a region of the second conductivity type and on which light for detection is incident, wherein part of said stack of semiconductor layers includes a mesa having first and second side surfaces spaced from and on opposite sides of said region of the second conductivity type, and first and second bottom surfaces respectively transverse to and extending from said first and second side surfaces, said first side surface extending through said second light absorption layer and said first semiconductor layer of the first conductivity type to said first bottom surface, said first bottom surface exposing said first semiconductor layer of the second conductivity type;
a first electrode electrically connected to said region of the second conductivity type;
a second electrode connected to said semiconductor substrate; and
a third electrode disposed on said first side surface of said mesa and electrically connecting said first semiconductor layer of the first conductivity type to said first semiconductor layer of the second conductivity type.

2. The semiconductor photosensitive element according to claim 1, wherein said region of the second conductivity type has an area transverse to said stack of semiconductor layers that is smaller than area of said first semiconductor layer of the second conductivity type.

3. The semiconductor photosensitive element according to claim 1, wherein the band gap energy of said first light absorption layer is the same as the band gap energy of said second light absorption layer.

4. The semiconductor photosensitive element according to claim 1, wherein:
said stack of semiconductor layers further includes a third light absorption layer, a second semiconductor layer of the second conductivity type, and a second semiconductor layer of the first conductivity type, arranged in this order from said semiconductor substrate, between said semiconductor substrate and said first light absorption layer, wherein said second side surface of said mesa extends along said second light absorption layer, said first semiconductor layer of the first conductivity type, said first semiconductor layer of the second conductivity type, and first light absorption layer, and said second bottom surface exposes said second semiconductor layer of the first conductivity type; and
a fourth electrode on said second side surface of said mesa and electrically connecting said second semiconductor layer of the first conductivity type to said second semiconductor layer of the second conductivity type.

5. The semiconductor photosensitive element according to claim 1, wherein said first semiconductor layer of the second conductivity type includes a first sub-layer and second sub-layer, said second sub-layer being connected to said third electrode and having a lower contact resistance to said third electrode than said first sub-layer.

6. The semiconductor photosensitive element according to claim 1, wherein said stack of semiconductor layers comprises a semiconductor layer having a lower charge carrier concentration than said first semiconductor layer of the second conductivity type and said first semiconductor layer of the first conductivity type, said semiconductor layer having a lower charge carrier concentration being located between said first semiconductor layer of the second conductivity type and said first semiconductor layer of the first conductivity type.

7. The semiconductor photosensitive element according to claim 1, wherein the band gap energy of said second light absorption layer is larger than the band gap energy of said first light absorption layer.

8. The semiconductor photosensitive element according to claim 1, further comprising a capacitor connected between said third electrode and said second electrode.

9. The semiconductor photosensitive element according to claim 5, wherein said stack of semiconductor layers comprises a semiconductor layer having a lower charge carrier concentration than said first semiconductor layer of the second conductivity type and said first semiconductor layer of the first conductivity type, said semiconductor layer having a lower charge carrier concentration being located between said first semiconductor layer of the second conductivity type and said first semiconductor layer of the first conductivity type.

10. The semiconductor photosensitive element according to claim 1, further comprising a second semiconductor layer of the first conductivity type on the second light absorption layer and including said region of the second conductivity type that is connected to said first electrode, wherein said first surface of said mesa includes a surface of said second semiconductor layer of the first conductivity type, and said third electrode contacts said second semiconductor layer of the first conductivity type.

11. The semiconductor photosensitive element according to claim 4, further comprising a third semiconductor layer of the first conductivity type on the second light absorption layer and including said region of the second conductivity type that is connected to said first electrode, wherein said first surface of said mesa includes a surface of said third semiconductor layer of the first conductivity type, said third electrode contacts said third semiconductor layer of the first conductivity type, said second surface of said mesa includes a surface of said third semiconductor layer of the first conductivity type, and said fourth electrode contacts said third semiconductor layer of the first conductivity type.

* * * * *